United States Patent [19]

Fatula, Jr. et al.

[11] 4,285,761
[45] Aug. 25, 1981

[54] PROCESS FOR SELECTIVELY FORMING REFRACTORY METAL SILICIDE LAYERS ON SEMICONDUCTOR DEVICES

[75] Inventors: Joseph J. Fatula, Jr., Beacon, N.Y.; Stanley Roberts, Shelburne, Vt.

[73] Assignee: International Business Machines Corporation, Armonk, N.Y.

[21] Appl. No.: 164,464

[22] Filed: Jun. 30, 1980

[51] Int. Cl.³ .................... H01L 21/24; H01L 21/306
[52] U.S. Cl. ...................................... 156/628; 29/571; 29/580; 29/590; 156/657; 156/662; 357/67; 427/93; 427/399
[58] Field of Search ................ 156/628, 657, 662; 29/571, 580, 590; 427/93, 399; 357/23, 67

[56] References Cited

U.S. PATENT DOCUMENTS

| | | | |
|---|---|---|---|
| 3,980,507 | 9/1976 | Carley | 156/628 |
| 4,090,915 | 5/1978 | Keller | 156/628 |
| 4,128,670 | 12/1978 | Gaenssien | 427/93 |
| 4,141,022 | 2/1979 | Sigg et al. | 357/23 |
| 4,180,596 | 12/1979 | Crowder et al. | 427/93 |
| 4,228,212 | 10/1980 | Brown et al. | 357/67 |

OTHER PUBLICATIONS

Zirinsky et al., "Oxulation . . . Films", Applied Physics Letters, vol. 33, No. 1, (Jul. 1978), pp. 76–78.
Ho et al., "Self–Aligned . . . Contact", IBM Technical Disclosure Bulletin, vol. 22, No. 12, (May, 1980), pp. 5336–5338.

Primary Examiner—Jerome W. Massie
Attorney, Agent, or Firm—Wolmar J. Stoffel

[57] ABSTRACT

A method of forming a refractory metal silicide pattern on a substrate by (1) forming a blanket layer of $SiO_2$ on the substrate, (2) depositing a blanket layer of polycrystalline Si over the $SiO_2$ layer, (3) defining a pattern in the blanket Si layer thereby exposing selected areas of the $SiO_2$ layer, (4) depositing a blanket layer of refractory metal silicide on the substrate over the $SiO_2$ and Si layers, (5) heating the substrate in an oxidizing environment to a temperature sufficient to oxidize the metal silicide layer over the Si to form an upper layer of $SiO_2$ and to convert the metal silicide layer overlying the $SiO_2$ layer to a metal rich $SiO_2$ layer, and exposing the oxidized surface to an etchant that selectively etches away the metal rich $SiO_2$ layer.

8 Claims, 5 Drawing Figures

PROCESS FOR SELECTIVELY FORMING REFRACTORY METAL SILICIDE LAYERS ON SEMICONDUCTOR DEVICES

DESCRIPTION

1. Technical Field

Our invention relates to electrically conductive lines and areas for semiconductor devices that are capable of withstanding high processing temperatures, more particularly, to metal silicide lines and contact pads, and to processes for depositing and defining such metal silicide lines and pads.

2. Background Art

Polycrystalline silicon lines that embody a suitable impurity for semiconductor devices have been suggested and used in semiconductor devices to replace the more conventional metal conductive lines. Polycrystalline silicon lines have been found to be particularly advantageous in the fabrication of insulated gate field effect transistor devices because the gate element can be formed and used to define the opening that determines the source and drain regions. This permits a very precise locating of the regions relative to the gate electrode, which would not be possible if the gates were fabricated after the source and drain regions were formed. A polycrystalline silicon gate electrode can be used to define the source and drain regions because it is capable of withstanding the high temperature necessary to introduce the impurities for semiconductor devices used to form the source and drain regions.

In some semiconductor device applications, particularly where a high device operating speed is desired, the conduction of polycrystalline silicon lines cannot be increased to the desired level. Lines formed of a refractory metal-silicide have been suggested to replace polycrystalline silicon as disclosed in U.S. Pat. No. 4,141,022. However, the fabrication of such metal-silicide lines have presented many technical problems. In general, the metal-silicide lines must be protected by an overlying insulating layer such as $SiO_2$. While the insulating layer can be conveniently formed, the defining of the lines from blanket layers of metal silicide and $SiO_2$ using photolithographic and subtracting etching techniques is difficult because the same etchant cannot be used to remove both materials. This requires the very precise determination of etching times in order to prevent over-etching which would seriously impact the integrity of the remaining line.

What is needed in the technology is a simple, dependable and inexpensive technique for defining metal silicide lines on semiconductor devices.

DISCLOSURE OF INVENTION

In accordance with the present invention, we provide a process for forming a metal-silicide layer on a polycrystalline silicon layer that is self-defining. In the process of our invention, a blanket silicon dioxide layer is grown on a semiconductor substrate, a layer of polycrystalline silicon is deposited over the silicon dioxide film and a desired pattern formed in the polycrystalline layer by lithography and etching techniques to expose portions of the underlying silicon dioxide layer, a metal silicide coating is deposited over the entire surface of the semiconductor substrate, the silicide coating is thermally oxidized wherein silicon dioxide is formed on the top surface of the metal silicide covering the polycrystalline silicon layer and a metal rich silicon dioxide layer formed over the metal silicide which is over the initially formed silicon dioxide layer, the substrate etched by a suitable etchant to remove the metal rich silicon dioxide layer formed over the initially formed silicon dioxide layer, thus leaving a self-defined metal silicide-polycrystalline silicon layer.

The method can further include the step of thermally oxidizing the structure to thicken the sidewalls of the metal silicide-polycrystalline silicon layer to thereby completely insulate the composite layer.

BRIEF DESCRIPTION OF THE DRAWINGS

The details of our invention will be described in connection with the accompanying drawing in which.

BEST MODE FOR CARRYING OUT THE INVENTION

Figure 1:
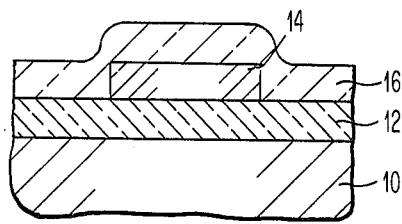
FIGS. 1 through 5 is a sequence of elevational views in broken section which illustrates the process steps of the method of the invention.

Referring now to the drawings, the cross-sectional views in broken section depict the substrate in various stages as the process of the invention is carried out. On substrate 10, a layer 12 of $SiO_2$ is formed. The substrate is typically a monocrystalline semiconductor substrate, typically silicon, which can contain various impurity regions (not shown) necessary to form the desired device structure. Layer 12 can be formed in any suitable manner to any desired thickness. Preferably the layer 12 is formed by thermally oxidizing the silicon surface of substrate 10. The thickness of layer 12 will depend on the particular structure fabricated in the substrate 10. When field effect transistors are fabricated in substrate 10, the thickness of layer 12 is typically in the range of 250–1,000Å. A blanket layer 14 of doped polycrystalline silicon is deposited on layer 12 and subsequently defined to leave the desired pattern. The blanket layer of polysilicon can be any suitable thickness but is preferably in the range of 2,000–4,000Å which is consistent with microminiaturized structure of modern integrated circuit devices. The layer 14 can be delineated in any suitable technique as for example, depositing a layer of photoresist, exposing the resist to the desired pattern and developing. The resist is retained over the areas of the polysilicon layer 14 which are to remain and the exposed portions removed by substractive etching. Alternately, the exposed portions could be removed by reactive ion etching. The areas of the polysilicon layer 14 that remain after the delineation step can be conductive metallurgy layers necessary to join the various active and passive element on the substrate 10 into operative circuits or the area can be used to define an insulated gate for a field effect transistor. In the drawings that follow, the layer 14 indicates the insulated gate of a field effect transistor. A blanket layer 16 of a metal silicide is deposited on the surface of substrate 10 over layer 14 and the exposed areas of layer 12 as indicated in FIG. 1. The thickness of layer 16 is in general governed by the thickness of layer 14. In general, the thickness of layer 16 should be comparable to the thickness of layer 14 which is preferably in the range of 2,000–4,000Å. The metal of the metal-silicide layer 16 is preferably a refractory metal such as tungsten, niobium, molybdenum, or tantalum. The metal silicide layer 16 can be deposited by any suitable technique. The preferred technique is co-evaporation of the metal and silicon by heating the respective targets of metal and silicon with E-beams. An alternate technique for evaporating the metal-silicide layer is RF sputtering the metal silicide from a target containing the right proportion of metal and silicon. Also, sputtering from two targets with the substrates mounted on a rotatable table may be used to produce the desired film. The proper proportion of silicon and metal can be determined by trial and error techniques. While it is desireable that one atom of metal be deposited with two atoms of silicon, the material of the target may contain a different proportion because the materials sputter off and are deposited at different rates.

Figure 2:
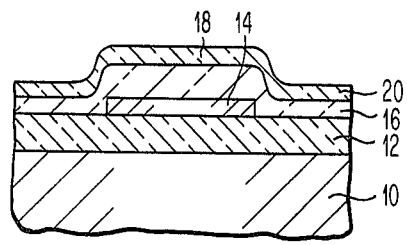
Figure 3:
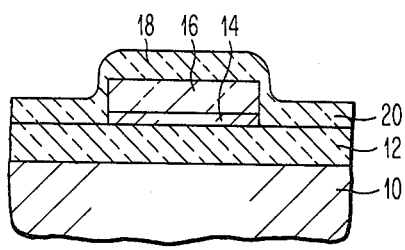

As indicated in FIG. 2, the metal silicide layer 14 is exposed to an oxidizing environment at a temperature and for a time to form a $SiO_2$ layer 18 over the top surface of the metal silicide layer 16 which overlies the polysilicon layer 14. In the oxidizing environment, the silicon material from layer 14 migrates through the metal silicide layer 16 and combines with oxygen to form $SiO_2$ layer 18. In contrast, over the areas of metal silicide layer 16 which overlie $SiO_2$ layer 12, a metal rich oxide layer 20 is formed which has a significantly higher etch rate than normal $SiO_2$. Metal silicide layer 16 over $SiO_2$ layer 12 decomposes thus liberating the metal or a metal oxide leaving behind a poor metal rich oxide 20. In FIG. 2, the layer 16 is indicated as being partially oxidized. In FIG. 3 layer 16 is indicated as being completely converted to the metal rich $SiO_2$ layer 20 over layer 12. As indicated, the polysilicon layer 14 has a decreased thickness since the silicon necessary to form the $SiO_2$ layer 18 is derived from layer 14. The metal silicide layer 16 over layer 14 is preserved.

Figure 4:
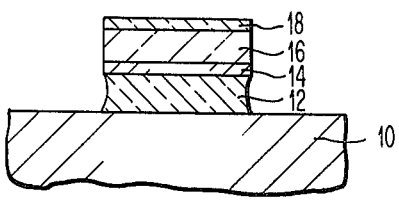

As indicated in FIG. 4 the substrate is exposed to an etchant for $SiO_2$, as for example a buffered hydrofluoric acid solution which selectively removes the metal rich oxide layer 20 leaving substantially the entire layer 18 of $SiO_2$. The rate at which layer 20 etches is significantly higher than the etch rate at which layer 18 is removed. It is understood that the layer 20 can be removed by other techniques as for example, plasma etch or reactive ion etching using an environment such as $CF_4+H_2$ which will remove the metal rich layer 20 at a significantly faster rate than the $SiO_2$ layer 18. It can be seen that highly conductive metal silicide areas can be deposited and delineated over polysilicon regions 14 and a $SiO_2$ encapsulating layer 18 formed over the metal silicide by this process. Referring to FIG. 4 when the metal silicide layer 16 is used as a gate for a field effect transistor, openings can be made on either side of the gate using conventional photolithographic and subtracting etching techniques to expose the surface of substrate 10. A portion of the layer 18 is also removed along with layer 12. Suitable impurities for semiconductors can then be introduced into substrate 10 forming regions 22 and 24 as indicated in FIG. 5.

Figure 5:
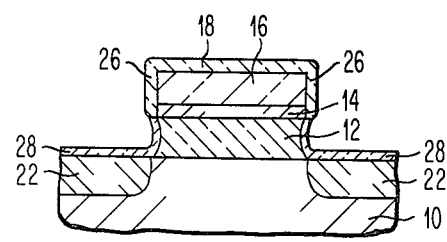

As indicated in FIG. 5, a protective layer 26 of $SiO_2$ can be formed on the sidewalls of metal silicide layer 16 by a further thermal oxidation step similar to the step used to grow layer 18 on the surface of the layer 16. In the oxidizing environment, silicon from layer 14 will migrate to the edge of layer 16 and combine with oxygen to form layer 26 which is an extension of layer 18 protecting the top surface. At the same time the surface of substrate 10 is oxidized, forming a thermal oxide layer 28.

While the invention has been illustrated and described with reference to preferred embodiments thereof, is to be understood that the invention is not limited to the precise construction herein disclosed and the right is reserved to all changes and modifications coming within the scope of the invention as defined in the appended claims.

We claim:

1. A method of forming and defining a refractory metal silicide layer on a substrate comprising, providing a blanket layer of $SiO_2$ on said substrate, depositing a blanket layer of polycrystalline Si over said layer of $SiO_2$, defining a pattern in said polycrystalline Si layer thereby exposing selected areas of said layer of $SiO_2$, depositing a blanket layer of refractory metal silicide on said substrate over said layers of $SiO_2$ and said polycrystalline Si, heating the composite substrate in an oxidizing environment to a temperature and for a time to thermally oxidize the metal silicide layer overlying said polycrystalline Si to form an upper layer of $SiO_2$, and to convert the metal silicide layers overlying the $SiO_2$ layer to a metal rich $SiO_2$ layer, exposing the oxidized surface of said substrate to an etchant that selectively etches said metal rich silicon dioxide layer to thereby expose said blanket layer of $SiO_2$.

2. The method of claim 1 wherein said metal of said refractory metal silicide is a metal selected from the group consisting of tungsten, niobium, molybdenum and tantalum, and mixtures thereof.

3. The method of claim 2 wherein said composite substrate is heated to a temperature in the range of 950° to 1,000° C.

4. The method of claim 3 wherein said polycrystalline Si layer has a thickness in the range of 2,500–4,000Å.

5. The method of claim 4 wherein heating of said composite substrate is at a temperature in the range of 900°–1,050° C., the oxidizing environment is dry oxygen, and the time of heating is on the order of 30 minutes.

6. The method of claim 2 wherein said metal silicide is deposited by co-evaporating the metal and silicon by heating with dual E-beams.

7. The method of claim 2 wherein said substrate is a monocrystalline Si substrate, and said $SiO_2$ layer is formed by thermally oxidizing said Si substrate.

8. The method of claim 2 wherein subsequent to the etching of the oxidized metal silicide, the sidewalls of the remaining metal silicide areas are thermally oxidized to form $SiO_2$ films on the sidewalls.

* * * * *